United States Patent
Hoeppel et al.

(10) Patent No.: US 12,087,893 B2
(45) Date of Patent: Sep. 10, 2024

(54) OPTOELECTRONIC SEMICONDUCTOR APPARATUS INCLUDING AN OPTOELECTRONIC SEMICONDUCTOR DEVICE HAVING A CARRIER WITH A ROUGHENED FIRST MAIN SURFACE AND METHOD FOR MANUFACTURING THEREOF

(71) Applicant: OSRAM Opto Semiconductors GmbH, Regensburg (DE)

(72) Inventors: Lutz Hoeppel, Alteglofsheim (DE); Attila Molnar, Penang (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 375 days.

(21) Appl. No.: 17/440,213

(22) PCT Filed: Mar. 16, 2020

(86) PCT No.: PCT/EP2020/057137
§ 371 (c)(1),
(2) Date: Sep. 17, 2021

(87) PCT Pub. No.: WO2020/187847
PCT Pub. Date: Sep. 24, 2020

(65) Prior Publication Data
US 2022/0149256 A1  May 12, 2022

(30) Foreign Application Priority Data
Mar. 19, 2019 (DE) .................... 10 2019 106 931.9

(51) Int. Cl.
*H01L 33/60* (2010.01)
*H01L 33/00* (2010.01)
(Continued)

(52) U.S. Cl.
CPC .......... *H01L 33/62* (2013.01); *H01L 33/0093* (2020.05); *H01L 33/22* (2013.01);
(Continued)

(58) Field of Classification Search
CPC ..... H01L 33/0093; H01L 33/22; H01L 33/60; H01L 33/62; H01L 2933/0058; H01L 2933/0066
(Continued)

(56) References Cited

U.S. PATENT DOCUMENTS

| 10,247,395 B2 | 4/2019 | Pu et al. |
| 2004/0188699 A1 | 9/2004 | Kameyama et al. |

(Continued)

FOREIGN PATENT DOCUMENTS

| DE | 102008032967 A1 | 1/2010 |
| DE | 202013012548 U1 | 7/2017 |

(Continued)

OTHER PUBLICATIONS

International Search Report based on Application PCT/EP2020/057137, dated Jun. 2, 2020. 2 pages (for informational purposes only).

(Continued)

*Primary Examiner* — Hoai V Pham
(74) *Attorney, Agent, or Firm* — Viering, Jentschura & Partner mbB; Samuel Y. Lo (57) ABSTRACT

An optoelectronic semiconductor device may include a carrier having a roughened first main surface and optoelectronic semiconductor chips arranged over the roughened first main surface. The combined surface area of the optoelectronic semiconductor chips is smaller than the surface area of the carrier, and a part of the roughened first main surface is arranged between adjacent optoelectronic semiconductor chips.

16 Claims, 7 Drawing Sheets

(51) Int. Cl.
*H01L 33/22* (2010.01)
*H01L 33/62* (2010.01)

(52) U.S. Cl.
CPC ...... *H01L 33/60* (2013.01); *H01L 2933/0058* (2013.01); *H01L 2933/0066* (2013.01)

(58) Field of Classification Search
USPC ...................................... 257/98, 99
See application file for complete search history.

(56) References Cited

U.S. PATENT DOCUMENTS

| | | |
|---|---|---|
| 2008/0315232 A1 | 12/2008 | Matsuo et al. |
| 2009/0127575 A1 | 5/2009 | Horng et al. |
| 2009/0267104 A1 | 10/2009 | Hsu et al. |
| 2011/0156066 A1 | 6/2011 | Yao et al. |
| 2011/0220952 A1 | 9/2011 | Choi et al. |
| 2015/0108527 A1* | 4/2015 | Hsieh ................ H01L 33/405 257/98 |
| 2015/0115278 A1 | 4/2015 | Ichikawa |
| 2015/0364452 A1 | 12/2015 | Zhu |

FOREIGN PATENT DOCUMENTS

| | | |
|---|---|---|
| DE | 102018112255 A1 | 11/2019 |
| DE | 102018123931 A1 | 4/2020 |
| JP | 2008047834 A | 2/2008 |
| JP | 2010003978 A | 1/2010 |

OTHER PUBLICATIONS

German Search Report based on Application 10 2019 106 931.9, dated Dec. 11, 2019, 2 pages (for informational purposes only).
German Examination Notification for corresponding German application No. 11 2020 001 307.3, dated Sep. 21, 2022, 4 pages (for informational purposes only).
German Office Action of corresponding German patent application 112020001307.3, dated Dec. 12, 2023, 10 pages (for informational purposes only).

* cited by examiner

OPTOELECTRONIC SEMICONDUCTOR APPARATUS INCLUDING AN OPTOELECTRONIC SEMICONDUCTOR DEVICE HAVING A CARRIER WITH A ROUGHENED FIRST MAIN SURFACE AND METHOD FOR MANUFACTURING THEREOF

CROSS-REFERENCE TO RELATED APPLICATIONS

The present application is a national stage entry according to 35 U.S.C. § 371 of PCT Application No. PCT/EP2020/057137 filed on Mar. 16, 2020; which claims priority to German Patent Application Serial No. 10 2019 106 931.9 filed on Mar. 19, 2019; all of which are incorporated herein by reference in their entirety and for all purposes.

TECHNICAL FIELD

An optoelectronic semiconductor device, an optoelectronic semiconductor apparatus, and a method for manufacturing an optoelectronic semiconductor device are specified.

BACKGROUND

A light emitting diode (LED) is a light emitting device based on semiconductor materials. For example, an LED includes a pn junction. When electrons and holes recombine with one another in the region of the pn junction, due, for example, to a corresponding voltage being applied, electromagnetic radiation is generated.

Generally, concepts are being sought which allow for the outcoupling efficiency of optoelectronic semiconductor devices to be improved.

An objective is to provide an improved optoelectronic semiconductor device, an improved optoelectronic semiconductor apparatus and an improved method for manufacturing an optoelectronic semiconductor device.

SUMMARY

An optoelectronic semiconductor apparatus comprises a housing, a lead frame, and an optoelectronic semiconductor device. The optoelectronic semiconductor device comprises a carrier having a roughened first main surface and having a mirror layer over a second main surface of the carrier, and an optoelectronic semiconductor chip which is arranged over the roughened first main surface. A surface area of the optoelectronic semiconductor chip is smaller than a roughened surface area of the carrier. The carrier has a greater lateral extension than the lead frame and completely covers the same. The housing is assembled with the lead frame. The lead frame is arranged on the side of the second main surface of the carrier.

For example, a further part of the roughened first main surface may be arranged between the optoelectronic semiconductor chip and an edge of the carrier.

The optoelectronic semiconductor chip may, for example, comprise a first semiconductor layer of a first conductivity type and a second semiconductor layer of a second conductivity type, the first and second semiconductor layers being arranged on top of each other.

For example, the first semiconductor layer may be arranged on a side facing the carrier. A first main surface of the first semiconductor layer may be roughened.

According to embodiments, the surface area of the carrier may be greater than 1.5 times the combined surface area of the optoelectronic semiconductor chip.

For example, the optoelectronic semiconductor chip may be connected to the roughened first main surface of the carrier through an amorphous inorganic connecting material.

According to embodiments, a horizontal surface of the lead frame, over which the optoelectronic semiconductor device is applied, may protrude from the housing in a vertical direction. A step is thus formed between the lead frame and the housing.

According to embodiments, the optoelectronic semiconductor apparatus may further comprise a reflective potting compound which is introduced between the carrier and the housing. The reflective potting compound may be directly adjacent to the carrier.

A method of manufacturing an optoelectronic semiconductor apparatus comprises forming an optoelectronic semiconductor chip, roughening a first main surface of a carrier, forming a mirror layer over a second main surface of the carrier and arranging the optoelectronic semiconductor chip over the roughened first main surface of the carrier. A surface area of the optoelectronic semiconductor chip is smaller than a surface area of the carrier. The method further comprises applying the carrier over a lead frame so that the lead frame is arranged on the side of the second main surface of the carrier. The carrier has a larger lateral extension than the lead frame and completely covers the same.

For example, forming the optoelectronic semiconductor chips may comprise forming a first semiconductor layer of a first conductivity type over a growth substrate and forming a second semiconductor layer of a second conductivity type over the first semiconductor layer.

The method may further comprise applying an intermediate carrier over the second semiconductor layer and detaching the growth substrate. For example, the intermediate carrier may be applied to the optoelectronic semiconductor chips in such a manner that the optoelectronic semiconductor chips are spaced apart from one another.

According to embodiments, the optoelectronic semiconductor chips are attached to the roughened first main surface of the carrier through an amorphous inorganic connecting material.

For example, the lead frame is assembled with a housing. A horizontal surface of the lead frame over which the optoelectronic semiconductor device is applied protrudes from the housing in a vertical direction.

The method may further include introducing a reflective potting compound between the carrier and the housing.

An optoelectronic semiconductor device comprises a carrier having a roughened first main surface, and optoelectronic semiconductor chips which are arranged over the roughened first main surface. A combined surface area of the optoelectronic semiconductor chips is smaller than a surface area of the carrier, and a region of the roughened first main surface is arranged between adjacent optoelectronic semiconductor chips.

According to embodiments, a further part of the roughened first main surface may be arranged between the optoelectronic semiconductor chip and an edge of the carrier.

For example, the optoelectronic semiconductor chips each comprise a first semiconductor layer of a first conductivity type and a second semiconductor layer of a second conductivity type, the first and second semiconductor layers being arranged on top of each other.

According to embodiments, the first semiconductor layer is arranged on a side facing the carrier, and a first main surface of the first semiconductor layer is roughened.

The optoelectronic semiconductor device may further comprise a dielectric mirror layer over a second main surface of the carrier.

For example, the surface of the carrier is greater than 1.5 times the combined surface area of the optoelectronic semiconductor chips.

For example, the optoelectronic semiconductor chips are connected to the roughened first main surface of the carrier through an amorphous inorganic connecting material.

An optoelectronic semiconductor apparatus comprises a housing, a lead frame and the optoelectronic semiconductor device as described above. The housing is assembled with the lead frame.

For example, the carrier of the optoelectronic semiconductor device has a greater lateral extension than the lead frame and completely covers the same. According to embodiments, a horizontal surface of the lead frame over which the optoelectronic semiconductor device is applied protrudes from the housing in a vertical direction.

According to embodiments, the optoelectronic semiconductor apparatus further comprises a reflective potting compound which is introduced between the carrier and the housing. The reflective potting compound is directly adjacent to the carrier, for example.

According to further embodiments, an optoelectronic semiconductor apparatus comprises a housing and a lead frame, the housing being assembled with the lead frame. The semiconductor apparatus further comprises a carrier having a first main surface, and an optoelectronic semiconductor chip which is arranged over the first main surface. A surface area of the optoelectronic semiconductor chip is smaller than a surface area of the carrier, and the carrier has a greater lateral extension than the lead frame and completely covers the same.

For example, a horizontal surface of the lead frame over which the optoelectronic semiconductor device is applied protrudes from the housing in a vertical direction.

A method for manufacturing an optoelectronic semiconductor device comprises forming optoelectronic semiconductor chips, roughening a first main surface of a carrier, and arranging the optoelectronic semiconductor chips over the roughened first main surface of a carrier. A combined surface area of the optoelectronic semiconductor chips is smaller than a surface area of the carrier. A region of the roughened first main surface is arranged between neighboring optoelectronic semiconductor chips.

Forming the optoelectronic semiconductor chips may, for example, comprise forming a first semiconductor layer of a first conductivity type over a growth substrate and forming a second semiconductor layer of a second conductivity type over the first semiconductor layer.

The method may further comprise applying an intermediate carrier over the second semiconductor layer and detaching the growth substrate.

According to embodiments, the intermediate carrier is applied to the optoelectronic semiconductor chips in such a manner that the optoelectronic semiconductor chips are spaced apart from one another.

For example, the optoelectronic semiconductor chips are attached to the roughened first main surface of the carrier through an amorphous inorganic connecting material.

According to further embodiments, a method for manufacturing an optoelectronic semiconductor apparatus comprises forming an optoelectronic semiconductor chip, arranging the optoelectronic semiconductor chip over a first main surface of a carrier and applying the carrier over a lead frame. A surface area of the optoelectronic semiconductor chip is smaller than a surface area of the carrier, the carrier of the optoelectronic semiconductor device has a greater lateral extension than the lead frame, and the carrier is applied to the lead frame in such a manner that the carrier completely covers the lead frame.

According to embodiments, the lead frame is assembled with a housing, and a horizontal surface of the lead frame over which the optoelectronic semiconductor device is applied protrudes from the housing in a vertical direction.

According to further embodiments, the method further comprises introducing a reflective potting compound between the carrier and the housing.

BRIEF DESCRIPTION OF THE DRAWINGS

The accompanying drawings serve to provide an understanding of exemplary embodiments. The drawings illustrate exemplary embodiments and, together with the description, serve for explanation thereof. Further exemplary embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material or of an insulating material, for example sapphire. Further examples of materials for growth substrates include glass, silicon dioxide, quartz or a ceramic.

Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN, and combinations of the materials mentioned. The stoichiometric ratio of the compound semiconductor materials may vary. Other examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical", as used in this description, is intended to describe an orientation which is essentially perpendicular to the first surface of a substrate or semiconductor body. The vertical direction may correspond, for example, to a direction of growth when layers are grown.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

Figure 1:
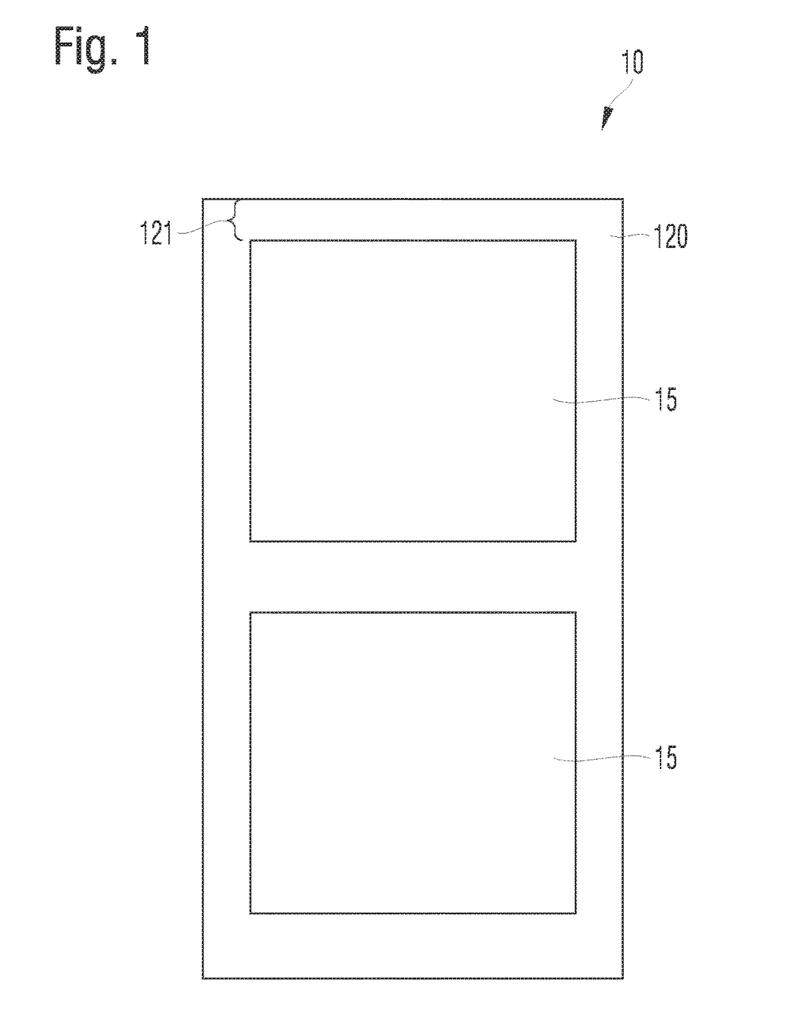
FIG. 1 shows a plan view of an optoelectronic semiconductor device according to embodiments.

FIG. 1 shows a view of an optoelectronic semiconductor device 10 according to embodiments. The optoelectronic semiconductor device 10 comprises a carrier 120 having a roughened first main surface 121, and epitaxially formed semiconductor regions or optoelectronic semiconductor chips 15 which are arranged over the roughened first main surface 121. A combined surface area of the optoelectronic semiconductor chips 15 is smaller than a surface area of the carrier 120. Furthermore, a region of the roughened first main surface 121 is arranged between adjacent epitaxially formed semiconductor regions 15.

Figure 2:
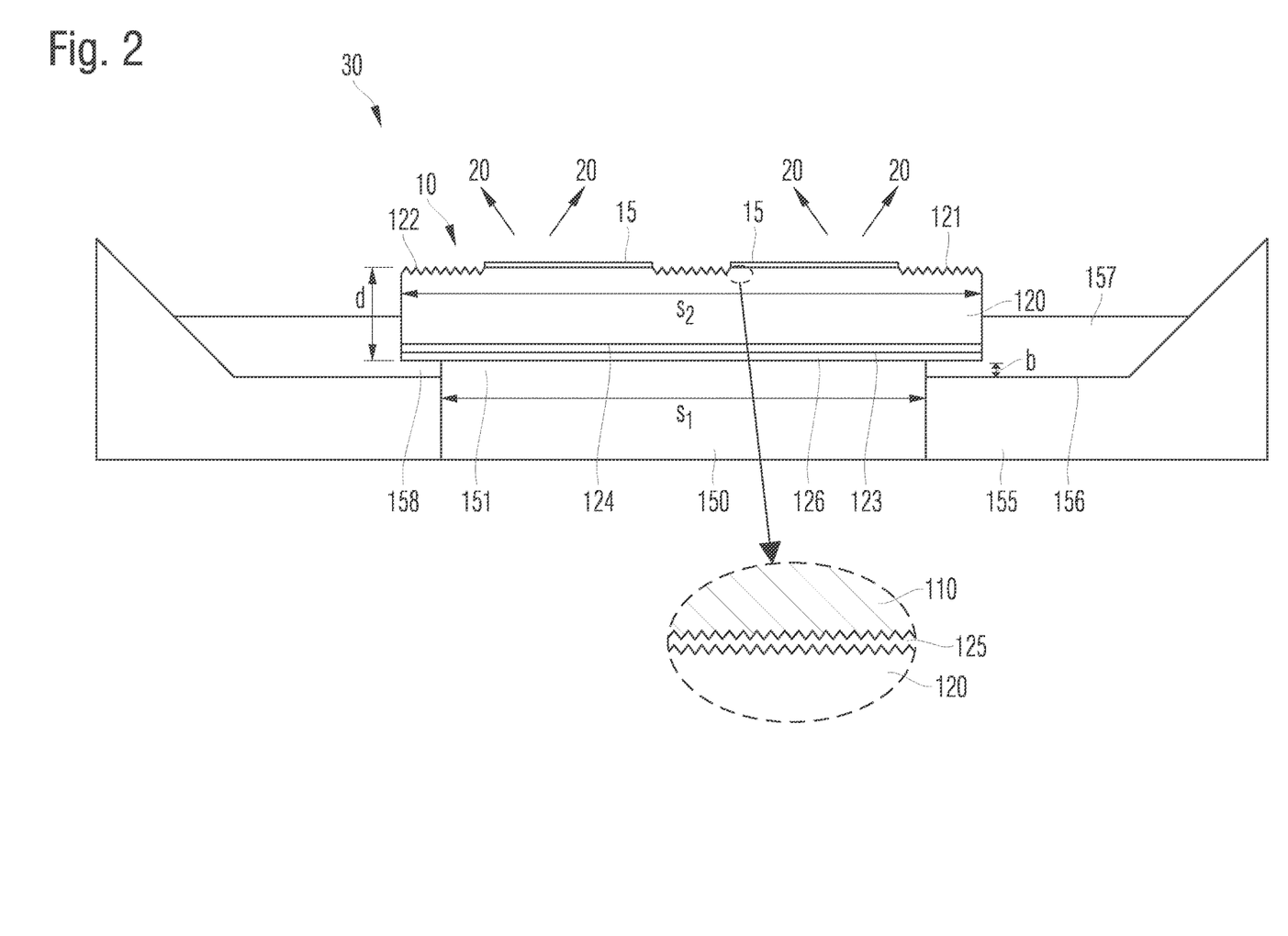
FIG. 2 shows a schematic vertical cross-sectional view of an optoelectronic semiconductor apparatus according to embodiments.

The roughened surface is illustrated in more detail in FIG. 2. For example, the optoelectronic semiconductor chips 15 may be arranged over the first main surface 121 of the carrier 120 in such a manner that a further part of the roughened first main surface 121 is arranged between the optoelectronic semiconductor chip 15 and an edge of the carrier.

Further elements of the optoelectronic semiconductor device will now be discussed in more detail with reference to FIG. 2.

The roughened first main surface 121 is roughened, so that a multiplicity of structures 122 protruding from the carrier material are formed. The protruding structures may be different from each another and may be arranged in a random manner, i.e. at randomly selected distances from each another. The roughness of the first main surface 121 improves the outcoupling efficiency from the carrier 120. For example, an average roughness $R_a$, which indicates the average distance between a measuring point on the main surface 121 and a center line, may be in a range from 200 nm to 2 µm. The center line may, for example, intersect the actual profile of the first main surface 121 in such a manner that the sum of the profile deviations (in relation to the center line) becomes minimal. The average roughness $R_a$, therefore, corresponds to the arithmetic mean of the absolute deviation from the center line.

The optoelectronic semiconductor chips 15 are arranged in such a manner that a respective region of the roughened first main surface 121 of the carrier is arranged between them. Furthermore, a part of the roughened first main surface 121 of the carrier is arranged respectively between the optoelectronic semiconductor chips 15 and the edge of the carrier. The carrier may for example be a sapphire carrier. In particular, a material of the carrier 120 is essentially absorption-free and has a suitable refractive index and suitable thermal conductivity. For example, the optoelectronic semiconductor chips 15 may be attached to the carrier 120 through a suitable adhesive, for example an adaptive connecting material 125 (see enlarged section of FIG. 2), and may be connected over the entire surface area. For example, the connecting material may contain inorganic materials such as amorphous aluminum oxide or silicon oxide. According to further embodiments, the connecting material does not contain any organic materials. For example, the carrier 120 may be a sapphire carrier. By using a connecting material 125 which contains an inorganic, amorphous material, it is possible to achieve improved optical and thermal connection of the optoelectronic semiconductor chip 15 to the carrier 120. For example, back reflections of electromagnetic radiation at the interface between the connecting material 125 and the carrier 120 may be avoided.

As the surface area of the carrier 120 is larger than the combined surface area of the individual semiconductor chips 15, it is possible to singulate the carrier 120 even if it is of greater thickness. According to embodiments, a thickness d of the carrier 120 may be up to approximately 350 µm. For example, a minimum thickness of the carrier may be about 50 µm.

According to further embodiments, it is also possible to form the semiconductor layers of the semiconductor chips 15 directly on the carrier 120, for example if the material of the carrier 120 is suitable as a growth substrate.

According to embodiments, the optoelectronic semiconductor device 10 may further comprise a dielectric mirror layer 124 on the side of the second main surface 123. In general, the term "dielectric mirror layer" encompasses any arrangement which reflects incident electromagnetic radiation to a large degree (for example>90%) and is non-conductive. For example, a dielectric mirror layer may be formed of a sequence of very thin dielectric layers having respectively different refractive indices. For example, the layers may alternatingly have a high refractive index (n>1.7) and a low refractive index (n<1.7) and may be formed as a Bragg reflector. For example, the layer thickness may be λ/4, wherein λ indicates the wavelength of the light to be reflected in the respective medium. The layer as viewed from the incident light may have a greater layer thickness, for example 3λ/4. Due to the small layer thickness and the difference in the respective refractive indices, the dielectric mirror layer provides high reflectivity and is at the same time non-conductive. A dielectric mirror layer may comprise 2 to 50 dielectric layers, for example. A typical layer thickness of the individual layers may be about 30 to 90 nm, for example about 50 nm. The layer stack may furthermore contain one or two or more layers that are thicker than about 180 nm, for example thicker than 200 nm. Optionally, a metallic layer 126, for example an Al layer, may additionally be arranged adjacent to the second main surface 123 of the carrier 120. In this manner, a good reflector is realized by the carrier 120.

According to further configurations, an optoelectronic semiconductor device comprises a carrier having a first main surface, and optoelectronic semiconductor chips which are arranged over the first main surface. A combined surface area of the optoelectronic semiconductor chips is smaller than a surface area of the carrier.

FIG. 2 shows an optoelectronic apparatus 30 comprising an optoelectronic semiconductor device 10. The optoelectronic semiconductor device 10 may be composed, for example, as described with reference to FIG. 1. According to further embodiments, the optoelectronic semiconductor device may have only one optoelectronic semiconductor chip, a surface area of the semiconductor chip being smaller than a surface area of the carrier.

The optoelectronic apparatus 30 shown in FIG. 2 comprises a lead frame 150 on which the optoelectronic semiconductor device 10 is applied. For example, a lateral extension s2 of the carrier 120 is greater than a lateral extension s1 of the lead frame 150. Furthermore, the carrier 120 completely covers the lead frame 150. More precisely, a part of the carrier 120 extends beyond an edge of the lead frame 150 in all horizontal directions. As a result, no region of the surface of the lead frame 150 is exposed that would need to be covered by a reflective material. The optoelectronic semiconductor device 10 and the lead frame 150 are assembled, for example, in such a manner that the optoelectronic semiconductor chips 15 overlap the lead frame 150. In other words, the optoelectronic semiconductor chips 15 do not extend beyond the edge of the lead frame in the horizontal direction. According to embodiments, a mirror layer 124, for example a dielectric mirror layer as described above, may be arranged over the second main surface 123 of the carrier 120. The mirror layer 124 may for example be arranged between the carrier 120 and the lead frame 150. In this manner, the radiation emitted in the direction of the lead frame 150 is reflected efficiently.

The optoelectronic semiconductor apparatus 30 furthermore comprises a housing 155 which is assembled with the lead frame 150. For example, the housing 155, the lead frame 150, and the carrier 120 may be assembled such that the lead frame 150 protrudes vertically above the housing 155 to a certain degree. More precisely, a horizontal surface of the lead frame 150 is arranged at a higher vertical position than a horizontal surface or mounting surface 156 of the housing 155. As a result, a small gap 158 is formed opposite the housing 155. The gap 158 has a vertical extension b. The housing 155 may completely enclose the lead frame 150. For example, the lead frame may have a rectangular shape and the housing 155 is directly adjacent to all four sides of the lead frame. The housing 155 may extend along the perimeter of the lead frame 150. The housing 155 and the lead frame 150 may be assembled such that the housing 155 and the lead frame do not overlap in the vertical direction. A part of the housing 155 may overlap with the carrier 120 in the vertical direction. A part of the housing 155 may overlap vertically with the part of the carrier 120 which is not covered with a semiconductor chip 15.

The optoelectronic semiconductor apparatus 30 may furthermore comprise a reflective potting compound 157. For example, the reflective potting compound may contain silicon containing $TiO_2$. The reflective potting compound covers the mounting surface 156 of the housing 155 and is directly adjacent to the carrier 120. As a result, absorption of the emitted electromagnetic radiation by the lead frame or the housing 155 may be avoided. Furthermore, emitted electromagnetic radiation may be reflected by the reflective potting compound 157, thereby increasing the efficiency of the device.

Electromagnetic radiation 20 emitted by the optoelectronic semiconductor chip 15 may be output via a side of the semiconductor chip 15 facing away from housing 155. In a corresponding manner, electromagnetic radiation may also be absorbed by the optoelectronic semiconductor chips 15. Supply lines or electrical contact elements for the electrical connection of the optoelectronic semiconductor chips 15 may for example be arranged in front of or behind the drawing plane shown. For example, leads may be routed through the lead frame 150.

According to embodiments, a semiconductor apparatus comprises a lead frame 150 and a carrier 120 having a first main surface 121 and one or more optoelectronic semiconductor chips which are arranged over the first main surface 121. A (combined) surface area of the optoelectronic semiconductor chip 15 is smaller than a surface area of the carrier 120. The carrier 120 has a greater lateral extension s2 than the lead frame 150 and completely covers the same.

Overall, by means of this semiconductor apparatus, an optoelectronic semiconductor apparatus of improved efficiency may be provided. In particular, it is possible to position the reflective potting compound 157 in the immediate vicinity of the outcoupling surface of the generated electromagnetic radiation of the carrier 120. The protruding surface area of the carrier 120 serves as a spacer between the reflective potting compound 157 and the flanks of the optoelectronic semiconductor chip 15. As a result, the reflective potting compound 157 is prevented from entering the immediate vicinity of the light-emitting flanks of the optoelectronic semiconductor chip. In the illustrated arrangement, the lead frame 150 is completely covered by the carrier 120 and the reflective potting compound 157. Accordingly, the lead frame is efficiently protected from aging.

For example, a size of the semiconductor chips 15 may each be more than $10 \times 10 \: \mu m^2$, for example $500 \times 500 \: \mu m^2$ or $700 \times 500 \: \mu m^2$ or $900 \times 500 \: \mu m^2$. The individual optoelectronic semiconductor chips 15 may be identical or different. For example, they may generate light at different emission wavelengths, e.g., emit red and blue light. The carrier may, for example, have a size of more than $300 \times 300 \: \mu m^2$, for example $1 \times 1 \: mm^2$ or $3 \times 3 \: mm^2$ for example. For example, the carrier 120 may have a surface area which is greater than 1.5 times or twice or three times the combined surface area of the optoelectronic semiconductor chips 15.

The second main surface 123 of the carrier 120 may additionally be roughened. A layer thickness of the reflective potting compound 157 may, for example, be greater than 30 µm, for example approximately 50 µm. A total size of the optoelectronic semiconductor apparatus 30, including the housing 155 and the lead frame 150, may for example be 3×3 mm² or more, for example 5×5 µm² or more.

Figure 3A:
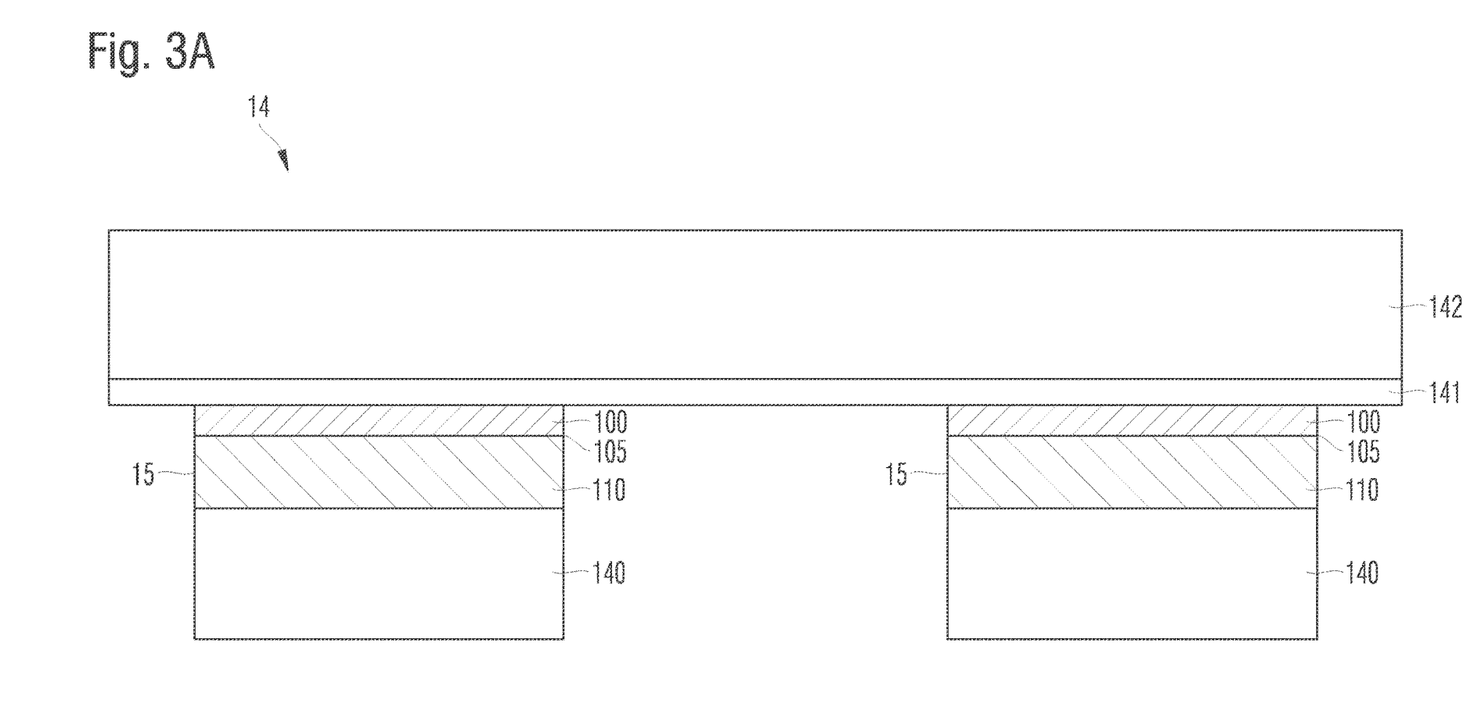
FIGS. 3A to 3C illustrate cross-sectional views of a workpiece in the course of performing the method according to embodiments.
Figure 3B:
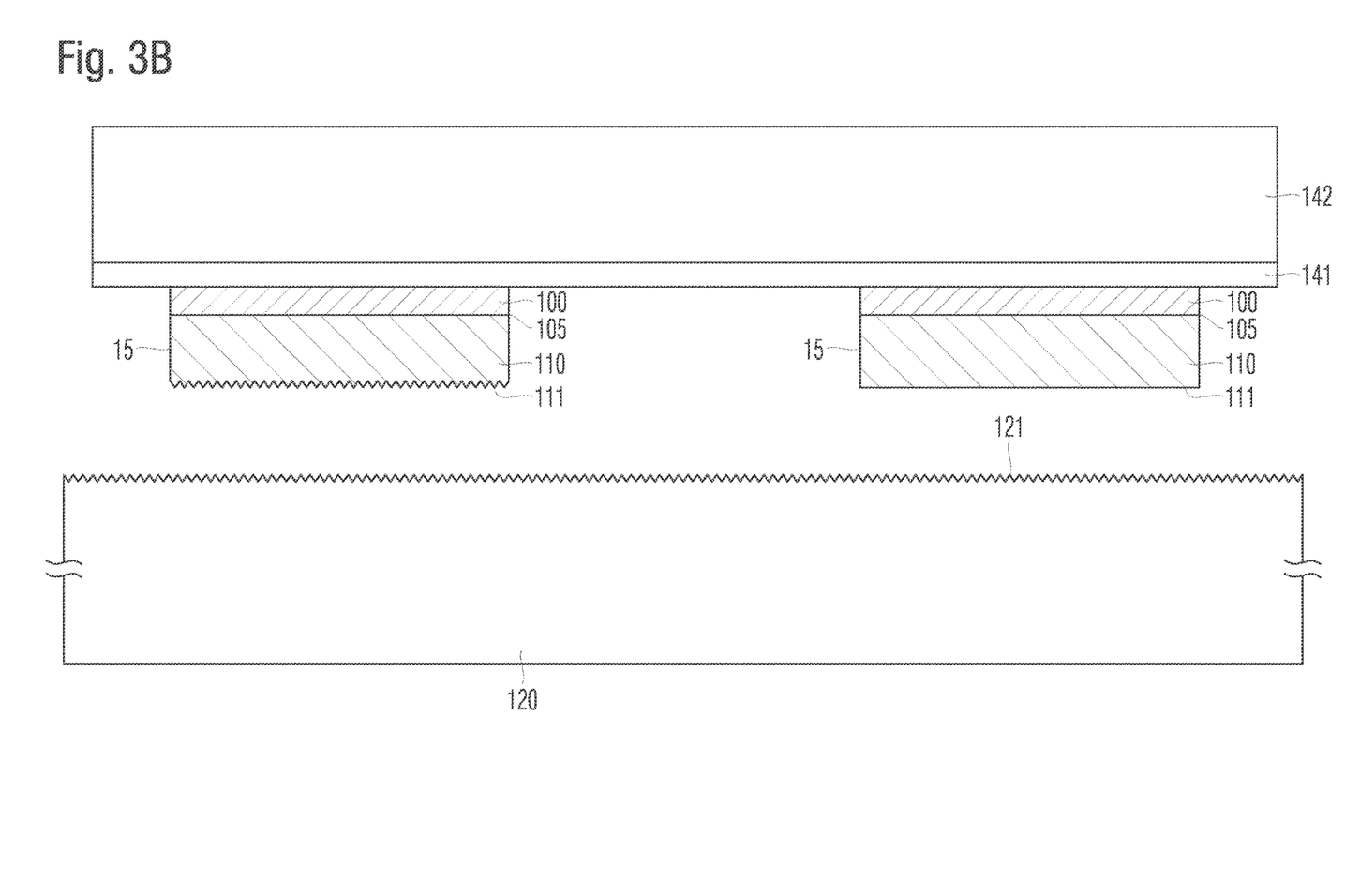
Figure 3C:
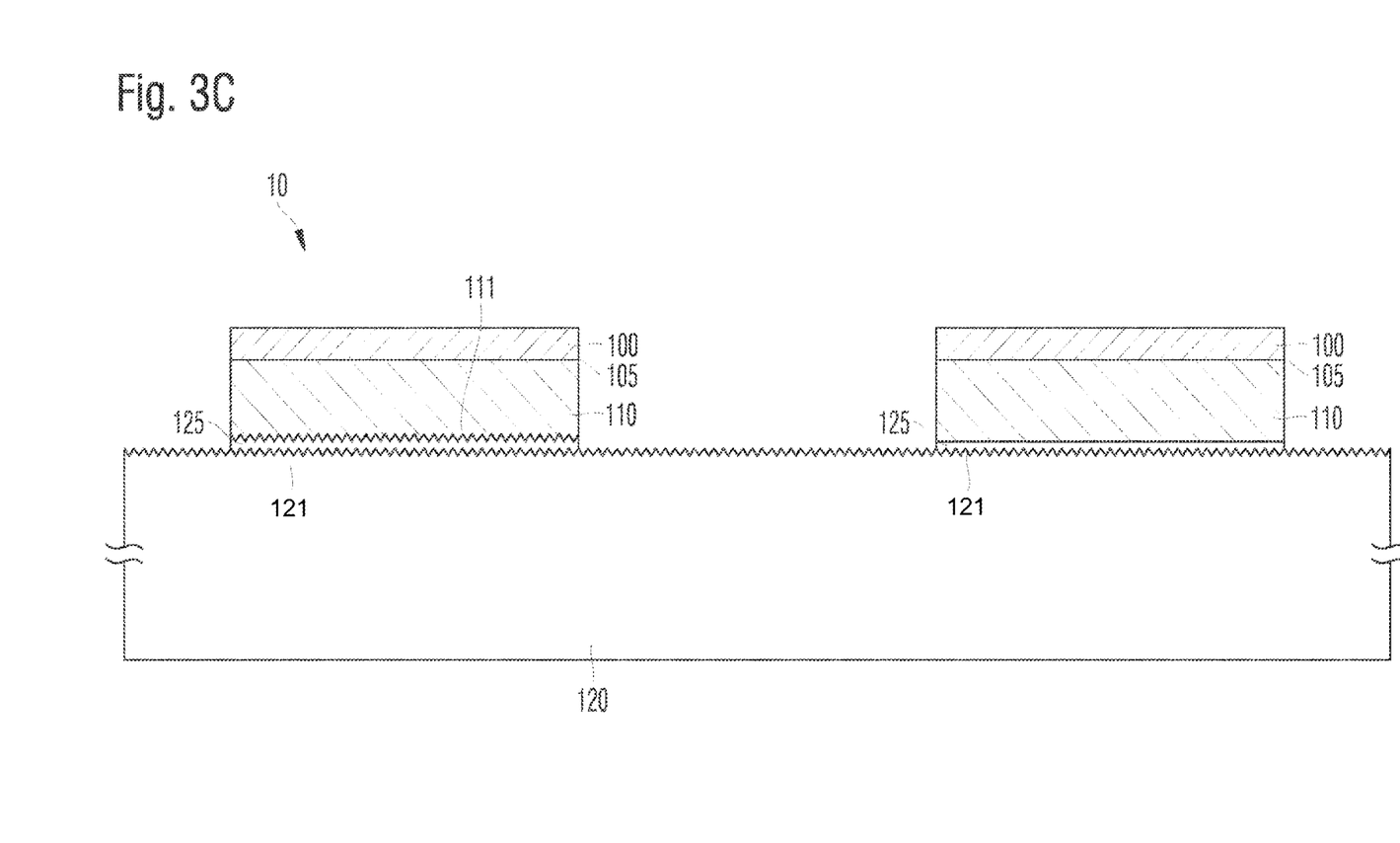

FIGS. 3A to 3C illustrate a workpiece 14 in the course of performing a method for manufacturing the described optoelectronic semiconductor device. A first semiconductor layer 110 of a first conductivity type, for example n-type, an active zone 105 and a second semiconductor layer 100 of a second conductivity type, for example p-type, may be grown epitaxially over a suitable growth substrate 140, for example made of GaN. Of course, layers made from other material systems may also be used. The applied layer stack is then connected to an intermediate carrier 142 through a connecting material or an adhesive 141. According to embodiments, optoelectronic semiconductor chips 15 are transferred to the carrier via a so-called expansion transfer method. In this case, in particular, a distance between adjacent semiconductor chips 15 is increased. This may be done, for example, by removing individual semiconductor chips from a semiconductor chip assembly.

FIG. 3A shows a vertical cross-sectional view of an example of a workpiece 14 in which two semiconductor chips 15 are connected to an intermediate carrier 142. The semiconductor layer stack is then detached from the growth substrate 140, for example by a laser lift-off method. For example, a first main surface 110 of the first semiconductor layer 110 may be roughened, for example by etching in hot KOH.

FIG. 3B shows an example of a resulting workpiece having a roughened surface 111 of the first semiconductor layer 110. According to further embodiments, the first main surface 111 of the first semiconductor layer 110 may not be roughened, as illustrated in the right-hand part of FIG. 3B. A first main surface 121 of a carrier 120, for example a sapphire carrier, is roughened. This is illustrated in the lower part of FIG. 3B.

Then, as shown in FIG. 3C, the two semiconductor chips 15 are connected to the roughened surface 121 of the carrier 120. For example, a connecting material 125 containing amorphous aluminum oxide or another inorganic connecting material 125, for example $SiO_2$, may be applied to the first main surface 111 of the first semiconductor layer 110. According to configurations, the connecting material 125 may also be applied to the roughened surface 121 of the carrier 120. For example, the connecting material 125 may be applied by a process such as sputtering, by a PVD process or by an ALD ("atomic layer deposit") process. Furthermore, a conditioning process may be carried out, for example by wet chemical pre-treatment or a plasma process, by which the number of OH groups on the surface of the connecting material 125 is increased. As a result, the adhesion of the optoelectronic semiconductor chip 15 to the carrier is improved.

As a result of the method, several semiconductor chips are transferred to a carrier 120 in one transfer step. For example, a multiplicity of optoelectronic semiconductor chips may be transferred by this method to a carrier substrate. After the transfer, the carrier substrate may be singulated into a multiplicity of carriers 120. FIG. 3C shows a cross-sectional view of an example of a resulting optoelectronic semiconductor device 10 after the intermediate carrier 142 has been detached.

To complete the optoelectronic semiconductor apparatus 30, the optoelectronic semiconductor device 10 may now be applied to the lead frame 150, which is assembled with the associated housing 155 (see FIG. 2). Then the reflective potting compound 157 is introduced. For example, the reflective potting compound 157 may be applied by a dispersion process. As the carrier 120 constitutes a spacer towards the semiconductor chip 15, no high level of positional accuracy is required when introducing the reflective potting compound 157. Consequently, higher concentrations of the reflective material, for example $TiO_2$, may be used in the potting compound. As a result, higher reflectivity and thus improved efficiency may be obtained.

Figure 4A:
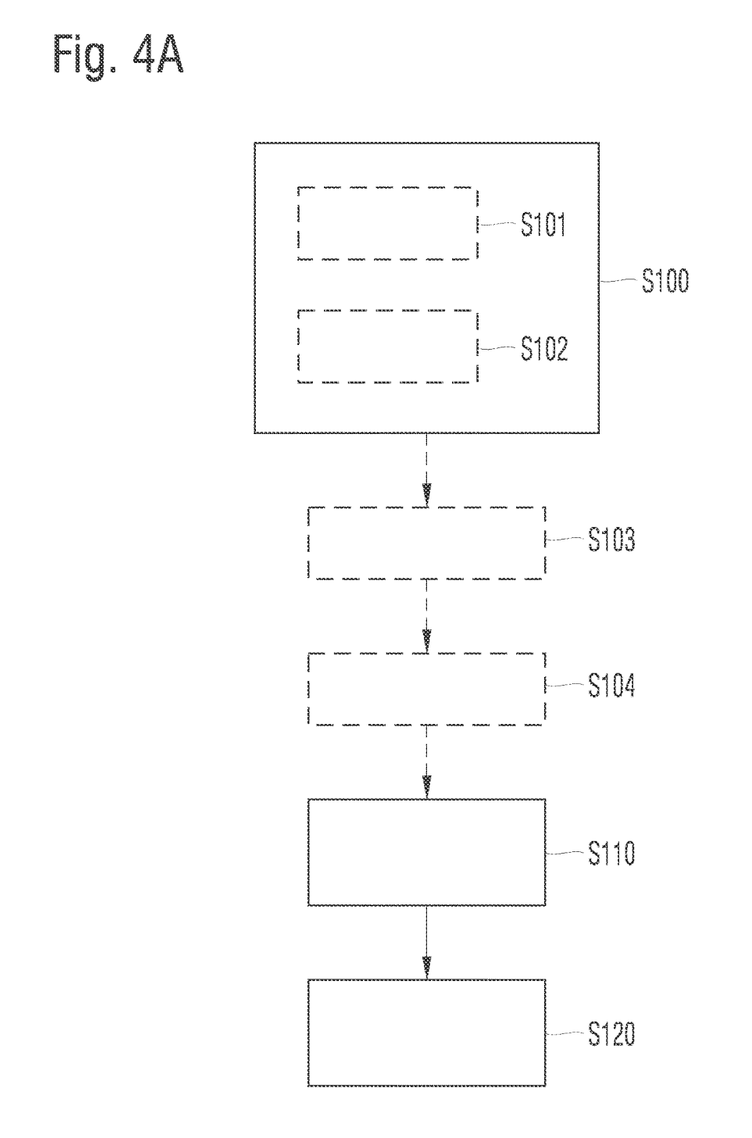
FIG. 4A outlines a method according to embodiments.

FIG. 4A outlines a method according to embodiments.

According to embodiments, a method for manufacturing an optoelectronic semiconductor device comprises forming (S100) optoelectronic semiconductor chips, roughening (S110) a first main surface of a carrier, and arranging (S120) the optoelectronic semiconductor chips over the roughened first main surface of a carrier, wherein a combined surface area of the optoelectronic semiconductor chips is larger than an surface area of the carrier, and a region of the roughened first main surface is arranged between adjacent optoelectronic semiconductor chips. The roughening of the first main surface of the carrier and the formation of the optoelectronic semiconductor chips may take place independently and in any order. For example, forming the optoelectronic semiconductor chips (S100) may include forming a first semiconductor layer (S101) of a first conductivity type over a growth substrate and forming (S102) a second semiconductor layer of a second conductivity type over the first semiconductor layer.

The method may furthermore comprise applying (S103) an intermediate carrier over the second semiconductor layer and detaching (S104) the growth substrate.

Figure 4B:
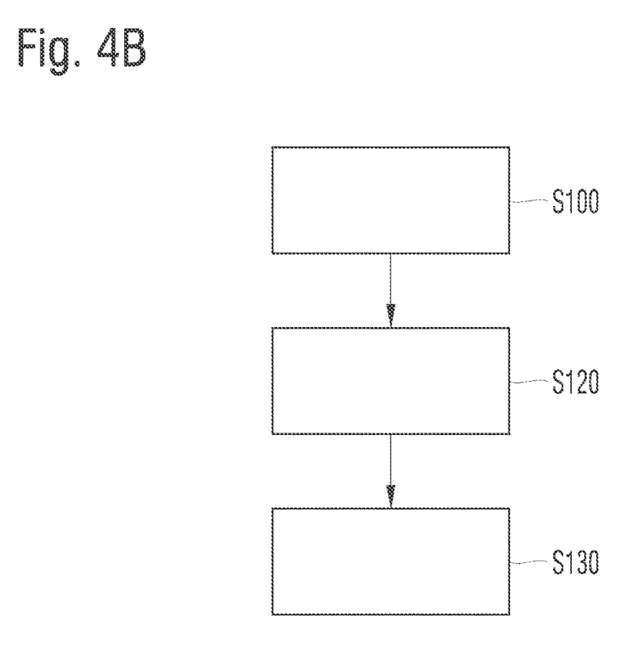
FIG. 4B outlines a method according to further embodiments.

FIG. 4B outlines a method for manufacturing an optoelectronic semiconductor apparatus. According to embodiments, a method for manufacturing an optoelectronic semiconductor apparatus comprises forming (S100) an optoelectronic semiconductor chip, arranging (S120) the optoelectronic semiconductor chip (15) over a first main surface of a carrier and applying (S130) the carrier over a lead frame. A surface area of the optoelectronic semiconductor chip is smaller than a surface area of the carrier, the carrier of the optoelectronic semiconductor device has a greater lateral extension than the lead frame, and the carrier is applied to the lead frame in such a manner that the carrier completely covers the lead frame.

The optoelectronic semiconductor apparatus described herein may be a general lighting apparatus, for example. The optoelectronic semiconductor apparatus described herein may also be used as a plant lighting apparatus.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

LIST OF REFERENCES 10 optoelectronic semiconductor device
14 workpiece
15 optoelectronic semiconductor chip 20 emitted electromagnetic radiation
30 optoelectronic semiconductor apparatus
100 second semiconductor layer
105 active zone
110 first semiconductor layer
111 first main surface of the first semiconductor layer
120 carrier
121 first main surface of the carrier
122 protruding structures
123 second main surface of the carrier
124 dielectric mirror layer
125 connecting material
126 metallic layer
140 growth substrate
141 adhesive
142 intermediate carrier
150 lead frame
151 surface of the lead frame
155 housing
156 mounting surface of the housing
157 reflective potting compound
158 gap

The invention claimed is:

1. An optoelectronic semiconductor apparatus comprising:
a housing;
a lead frame; and
an optoelectronic semiconductor device;
the optoelectronic semiconductor device comprising:
a carrier having a roughened first main surface and having a mirror layer over a second main surface of the carrier; and
an optoelectronic semiconductor chip arranged over the roughened first main surface,
wherein a surface area of the optoelectronic semiconductor chip is smaller than a roughened surface area of the carrier, wherein the carrier has a greater lateral extension than the lead frame and the carrier completely covers the lead frame, wherein the housing is assembled with the lead frame, and wherein the lead frame is arranged on the side of the second main surface of the carrier.

2. The optoelectronic semiconductor apparatus according to claim 1, wherein a further part of the roughened first main surface is arranged between the optoelectronic semiconductor chip and an edge of the carrier.

3. The optoelectronic semiconductor apparatus according to claim 1, wherein the optoelectronic semiconductor chip comprises a first semiconductor layer of a first conductivity type and a second semiconductor layer of a second conductivity type, the first and second semiconductor layers being arranged on top of each other.

4. The optoelectronic semiconductor apparatus according to claim 3, wherein the first semiconductor layer is arranged on a side facing the carrier, and a first main surface of the first semiconductor layer is roughened.

5. The optoelectronic semiconductor apparatus according to claim 1, wherein the surface area of the carrier is greater than 1.5 times the combined surface area of the optoelectronic semiconductor chip.

6. The optoelectronic semiconductor apparatus according to claim 1, wherein the optoelectronic semiconductor chip is connected to the roughened first main surface of the carrier through an amorphous inorganic connecting material.

7. The optoelectronic semiconductor apparatus according to claim 1, wherein a horizontal surface of the lead frame over which the optoelectronic semiconductor device is applied protrudes from the housing in a vertical direction.

8. The optoelectronic semiconductor apparatus according to claim 1, further comprising a reflective potting compound arranged between the carrier and the housing.

9. The optoelectronic semiconductor apparatus according to claim 8, wherein the reflective potting compound is directly adjacent to the carrier.

10. A method of manufacturing an optoelectronic semiconductor apparatus comprising:
forming an optoelectronic semiconductor chip;
roughening a first main surface of a carrier;
forming a mirror layer over a second main surface of the carrier;
arranging the optoelectronic semiconductor chip over the roughened first main surface of the carrier, a surface area of the optoelectronic semiconductor chip being smaller than a surface area of the carrier, and
applying the carrier over a lead frame, so that the lead frame is arranged on the side of the second main surface of the carrier,
wherein the carrier has a greater lateral extension than the lead frame and the carrier completely covers the lead frame.

11. The method according to claim 10, wherein forming the optoelectronic semiconductor chips comprises forming a first semiconductor layer of a first conductivity type over a growth substrate and forming a second semiconductor layer of a second conductivity type over the first semiconductor layer.

12. The method according to claim 11, further comprising applying an intermediate carrier over the second semiconductor layer and detaching the growth substrate.

13. The method according to claim 12, wherein the intermediate carrier is applied to the optoelectronic semiconductor chips in such a manner that the optoelectronic semiconductor chips are spaced apart from one another.

14. The method according to claim 10, wherein the optoelectronic semiconductor chips are attached to the roughened first main surface of the carrier through an amorphous inorganic connecting material.

15. The method according to claim 10, wherein the lead frame is assembled with a housing, and wherein a horizontal surface of the lead frame over which the optoelectronic semiconductor device is applied, protrudes from the housing in a vertical direction.

16. The method according to claim 15, further comprising arranging a reflective potting compound between the carrier and the housing.

* * * * *